US008039355B2

(12) United States Patent
Lee

(10) Patent No.: US 8,039,355 B2
(45) Date of Patent: Oct. 18, 2011

(54) METHOD FOR FABRICATING PIP CAPACITOR

(75) Inventor: Jong-Ho Lee, Gwangmyeong-si (KR)

(73) Assignee: Dongbu HiTek Co., Ltd., Seoul (KR)

( * ) Notice: Subject to any disclaimer, the term of this patent is extended or adjusted under 35 U.S.C. 154(b) by 2 days.

(21) Appl. No.: 12/632,115

(22) Filed: Dec. 7, 2009

(65) Prior Publication Data

US 2010/0163947 A1 Jul. 1, 2010

(30) Foreign Application Priority Data

Dec. 26, 2008 (KR) ........................ 10-2008-0134229

(51) Int. Cl.
*H01L 21/20* (2006.01)

(52) U.S. Cl. ........ 438/396; 438/381; 438/382; 257/296; 257/E21.004; 257/E21.008; 257/E29.342

(58) Field of Classification Search .......... 438/381–382, 438/396; 257/296, E21.004, E21.008, E29.342
See application file for complete search history.

(56) References Cited

U.S. PATENT DOCUMENTS

| | | | | | |
|---|---|---|---|---|---|
| 4,466,177 | A | * | 8/1984 | Chao | 438/251 |
| 5,356,826 | A | * | 10/1994 | Natsume | 438/238 |
| 5,470,775 | A | * | 11/1995 | Nariani | 438/384 |
| 5,554,873 | A | * | 9/1996 | Erdeljac et al. | 257/380 |
| 5,584,964 | A | * | 12/1996 | Umimoto et al. | 438/632 |
| 5,597,759 | A | * | 1/1997 | Yoshimori | 438/384 |
| 5,618,749 | A | * | 4/1997 | Takahashi et al. | 438/384 |
| 5,780,333 | A | * | 7/1998 | Kim | 438/238 |
| 6,096,600 | A | * | 8/2000 | Azami | 438/250 |
| 6,124,160 | A | * | 9/2000 | Segawa et al. | 438/238 |
| 6,156,602 | A | * | 12/2000 | Shao et al. | 438/238 |
| 6,156,603 | A | * | 12/2000 | Tung | 438/239 |
| 6,171,901 | B1 | * | 1/2001 | Blair et al. | 438/250 |
| 6,204,104 | B1 | * | 3/2001 | Fujii | 438/234 |
| 6,204,105 | B1 | * | 3/2001 | Jung | 438/238 |
| 6,246,084 | B1 | * | 6/2001 | Kim | 257/296 |
| 6,313,516 | B1 | * | 11/2001 | Tsui et al. | 257/538 |
| 6,338,997 | B2 | * | 1/2002 | Yoshikawa | 438/250 |
| 6,432,791 | B1 | * | 8/2002 | Hutter et al. | 438/381 |
| 6,492,672 | B1 | * | 12/2002 | Segawa et al. | 257/296 |
| 6,603,172 | B1 | * | 8/2003 | Segawa et al. | 257/328 |
| 6,627,971 | B1 | * | 9/2003 | Shen et al. | 257/538 |
| 6,686,286 | B2 | * | 2/2004 | Yoon | 438/696 |
| 6,731,494 | B2 | * | 5/2004 | Nakamura | 361/306.1 |
| 6,777,777 | B1 | * | 8/2004 | Kar-Roy et al. | 257/532 |
| 6,995,412 | B2 | * | 2/2006 | Fried et al. | 257/296 |

(Continued)

*Primary Examiner* — N Drew Richards
*Assistant Examiner* — Ankush Singal
(74) *Attorney, Agent, or Firm* — Sherr & Vaughn, PLLC

(57) ABSTRACT

A PIP capacitor and methods thereof. A method of fabricating a PIP capacitor may include forming a field oxide film over a silicon substrate to define a device isolating region and/or an active region. A method of fabricating a PIP capacitor may include forming a lower polysilicon electrode having doped impurities on and/or over an field oxide film. A method of fabricating a PIP capacitor may include performing an oxidizing step to form a first oxide film over a polysilicon and/or a second oxide film on and/or over an active region. A method of fabricating a PIP capacitor may include forming an upper polysilicon electrode on and/or over a region of a first oxide film and forming a gate electrode on and/or over a second oxide film at substantially the same time. A method of fabricating a PIP capacitor may include forming a polysilicon resistor. A PIP capacitor is disclosed.

11 Claims, 5 Drawing Sheets

U.S. PATENT DOCUMENTS

| | | | |
|---|---|---|---|
| 7,078,310 B1 * | 7/2006 | Kar-Roy et al. | 438/396 |
| 7,214,979 B2 * | 5/2007 | Budge et al. | 257/296 |
| 7,217,613 B2 * | 5/2007 | Racanelli | 438/238 |
| 7,217,981 B2 * | 5/2007 | Coolbaugh et al. | 257/380 |
| 7,307,000 B2 * | 12/2007 | Choi | 438/393 |
| 7,528,032 B2 * | 5/2009 | Hasegawa et al. | 438/238 |
| 7,601,600 B2 * | 10/2009 | Ko et al. | 438/306 |
| 7,623,338 B2 * | 11/2009 | Won | 361/306.3 |
| 7,855,422 B2 * | 12/2010 | Hu et al. | 257/379 |
| 2002/0008302 A1 * | 1/2002 | Singh et al. | 257/538 |
| 2002/0056869 A1 * | 5/2002 | Morimoto | 257/313 |
| 2002/0063271 A1 * | 5/2002 | Kim | 257/295 |
| 2002/0098633 A1 * | 7/2002 | Budge et al. | 438/184 |
| 2002/0111025 A1 * | 8/2002 | Weybright et al. | 438/689 |
| 2002/0155626 A1 * | 10/2002 | Park | 438/3 |
| 2003/0008468 A1 * | 1/2003 | Park | 438/393 |
| 2004/0132251 A1 * | 7/2004 | Yoshino et al. | 438/267 |
| 2004/0209423 A1 * | 10/2004 | Tian et al. | 438/253 |
| 2004/0241951 A1 * | 12/2004 | Amadon et al. | 438/382 |
| 2004/0248359 A1 * | 12/2004 | Hieda | 438/239 |
| 2005/0064658 A1 * | 3/2005 | Biery et al. | 438/239 |
| 2005/0082592 A1 * | 4/2005 | Chang et al. | 257/306 |
| 2005/0106805 A1 * | 5/2005 | Olson | 438/238 |
| 2005/0124133 A1 * | 6/2005 | Tu | 438/397 |
| 2005/0139887 A1 * | 6/2005 | Song | 257/296 |
| 2005/0221556 A1 * | 10/2005 | Futatsugi et al. | 438/239 |
| 2006/0145296 A1 * | 7/2006 | Coolbaugh et al. | 257/536 |
| 2007/0096183 A1 * | 5/2007 | Ogawa et al. | 257/300 |
| 2007/0099374 A1 * | 5/2007 | Ko | 438/234 |
| 2007/0267705 A1 * | 11/2007 | Won et al. | 257/379 |
| 2008/0055816 A1 * | 3/2008 | Park et al. | 361/301.4 |
| 2009/0059466 A1 * | 3/2009 | Park | 361/301.4 |
| 2009/0115023 A1 * | 5/2009 | Kim | 257/532 |
| 2009/0127655 A1 * | 5/2009 | Lee | 257/532 |

* cited by examiner

METHOD FOR FABRICATING PIP CAPACITOR

The present application claims priority under 35 U.S.C. 119 to Korean Patent Application No. 10-2008-0134229 (filed on Dec. 26, 2008) which is hereby incorporated by reference in its entirety.

BACKGROUND

Embodiments relate to methods of fabricating a semiconductor device. Some embodiments relate to a method of fabricating a Polysilicon-Insulator-Polysilicon capacitor.

A Polysilicon-Insulator-Polysilicon (PIP) capacitor may be used to prevent an analog device from emitting noise and/or modulation of frequency. Since a PIP capacitor may have a lower electrode and an upper electrode formed of polysilicon, which may be a similar material as a gate electrode of a logic transistor, electrodes of a PIP capacitor may be formed together with a gate electrode without separate forming processes. When a device requires relatively large capacitance, a PIP capacitor may be used.

Figure 1:
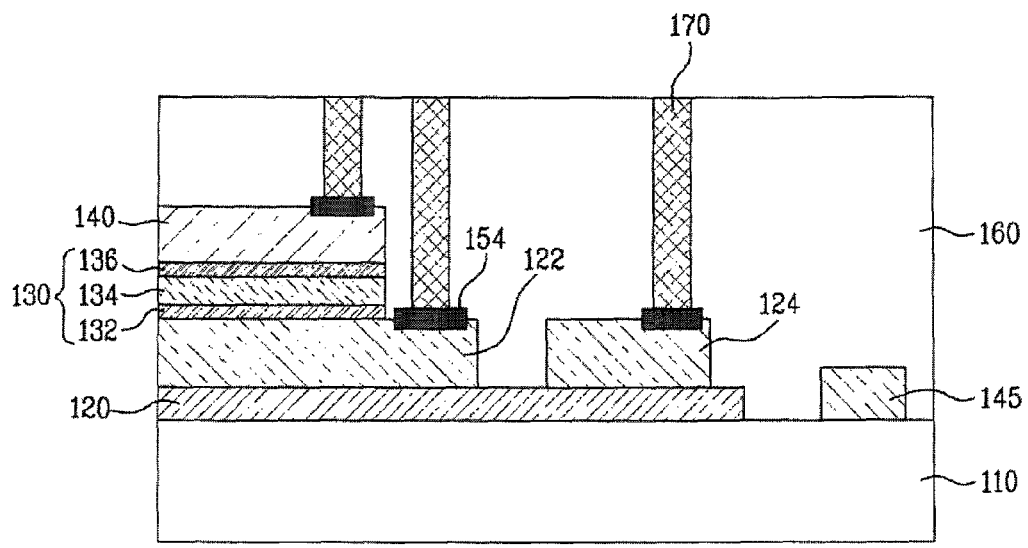

In a PIP capacitor, there may be a structure which uses an oxide-nitride-oxide (ONO) as an insulating material and/or a structure which uses an oxide film as an insulating material. FIG. 1 illustrates a cross section of a PIP capacitor having an ONO structure. A PIP capacitor having an ONO structure may be provided with lower polysilicon electrode 122 formed on and/or over field oxide film 120 on and/or over substrate 110. ONO films 132, 134 and/or 136, and/or upper polysilicon electrode 140 may be provided. Polysilicon resistor 124 on and/or over field oxide film 120 may be formed at substantially the same time with lower polysilicon electrode 122. Gate electrode 145 may be formed at an active region at substantially the same time with upper polysilicon electrode 140.

A PIP capacitor may have capacitance fixed by a thickness of nitride 134. If nitride 134 is relatively thick, a portion of the nitride may remain on and/or over lower polysilicon electrode 122 of a PIP capacitor in etching ONO layer 130. A failure of formation of silicide 154 on and/or over lower polysilicon electrode 122 may occur during a subsequent silicide step.

Figure 2:
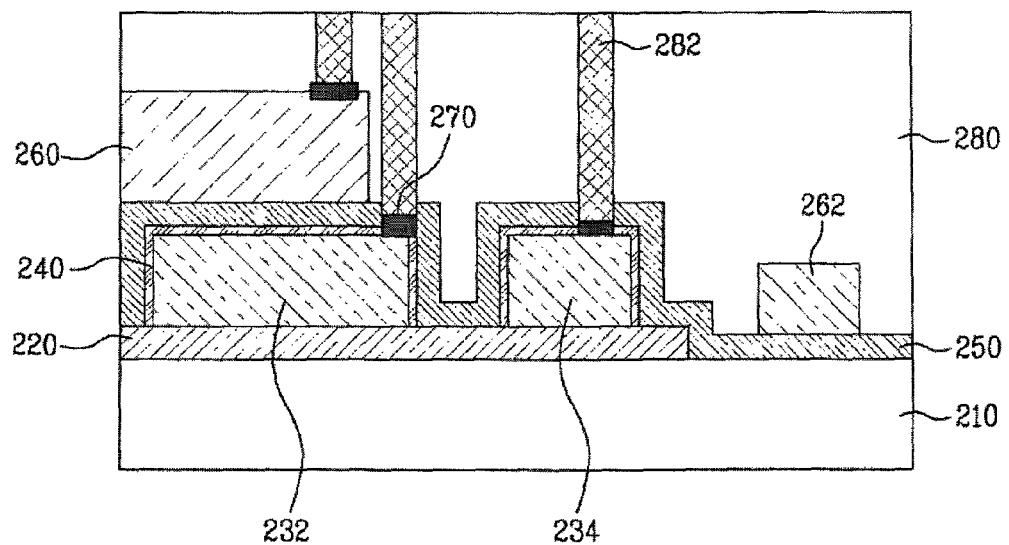

FIG. 2 illustrates a cross section of a PIP capacitor having an oxide film structure. A PIP capacitor may be provided with lower polysilicon electrode 232 formed on and/or over field oxide film 220 on and/or over silicon substrate 210. Polysilicon oxide film 240, gate oxide film 250, and/or upper polysilicon electrode 260 may be provided. Polysilicon resistor 234 may be provided on and/or over field oxide film 220 and may be formed at substantially the same time with lower polysilicon electrode 232. Gate electrode 262 may be formed at an active region at substantially the same time with upper polysilicon electrode 260.

A thickness of an oxide film that may be an insulating material of a PIP capacitor having an oxide film structure may be fixed by a polysilicon oxidizing step, a gate oxide film forming step, and/or a washing step. A polysilicon oxidizing step may refer to a step of making first oxide film 240 grow on and/or over lower polysilicon electrode 232. A gate oxide film forming step may relate to a step of forming gate oxide film 250 on and/or over silicon substrate 210 at an active region. A washing step may relate to a step of removing first oxide film 240 formed substantially evenly at an active region in a polysilicon oxidizing step before a gate oxide film forming step.

A thickness of an oxide film, for example, a first oxide film and/or a gate oxide film, formed on and/or over lower polysilicon electrode 232 may be fixed by a polysilicon oxidizing step and/or a gate oxide film forming step. A washing step, which may be performed to remove first oxide film 240 from an active region before a gate oxide film forming step, may impair uniformity of a transistor formed on and/or over an active region. Moreover, an amount of loss of silicon required for growth of an oxide film may increase during the two oxidizing steps, resulting in a relative reduction of thickness of lower polysilicon electrode 232.

Accordingly, there is a need to provide a method of fabricating a PIP capacitor which may secure substantial uniformity of a transistor, formation of silicide and/or relative thickness of polysilicon of a lower electrode. There is a need to provide a method of fabricating a PIP capacitor which may maximize productivity, for example by minimizing washing and/or furnace steps.

SUMMARY

Embodiments relate to a method of fabricating a PIP capacitor. According to embodiments, a method of fabricating a PIP capacitor may secure substantial uniformity of a transistor, formation of silicide and/or thickness of polysilicon of a lower electrode. In embodiments, a method of fabricating a PIP capacitor may maximize productivity, for example by minimizing washing and/or furnace steps.

According to embodiments, a method of fabricating a PIP capacitor may include forming a field oxide film on and/or over a silicon substrate which may define a device isolating region and/or an active region. In embodiments, a method of fabricating a PIP capacitor may include forming a lower polysilicon electrode, which may have doped impurities, on and/or over a field oxide film. In embodiments, a method of fabricating a PIP capacitor may include a gate oxidizing step, which may include performing an oxidizing step to form a first oxide film on and/or over a top and/or side walls of a lower polysilicon electrode having impurities doped therein and/or to grow a second oxide film on and/or over an active region of a silicon substrate at a time. In embodiments, a method of fabricating a PIP capacitor may include forming an upper polysilicon electrode on and/or over a region of a first oxide film and, at substantially the same time, forming a gate electrode on and/or over a second oxide film.

Embodiments relate to a method of fabricating a PIP capacitor. According to embodiments, a method of fabricating a PIP capacitor may include forming a field oxide film on and/or over a silicon substrate, which may define a device isolating region and/or an active region. In embodiments, a method of fabricating a PIP capacitor may include forming a lower polysilicon electrode and/or a polysilicon resistor, which may have doped impurities, on and/or over a field oxide film In embodiments, a method of fabricating a PIP capacitor may include a gate oxidizing step, which may include performing an oxidizing step to form oxide films on and/or over tops and/or side walls of a lower polysilicon electrode and a polysilicon resistor, respectively, having impurities doped therein and/or on and/or over an active region of a silicon substrate. In embodiments, a method of fabricating a PIP capacitor may include forming an upper polysilicon electrode on and/or over a region of an oxide film formed on and/or over a lower polysilicon electrode and, at substantially the same time, forming a gate electrode on and/or or over a oxide film on and/or over a active region.

According to embodiments, in a method of fabricating a PIP capacitor, simultaneous formation of a gate oxide film and an oxide film which may be an insulating film of a PIP capacitor having increasing doping concentration of a lower polysilicon electrode may secure substantial uniformity of a transistor, secure formation of a silicide, and/or a thickness of a lower polysilicon electrode, and/or minimize a washing step and/or a furnace step to maximize productivity.

DRAWINGS

Example FIG. 1 illustrates a cross section of a PIP capacitor having a oxide-nitride-oxide (ONO) structure.

Example FIG. 2 illustrates a cross section of a PIP capacitor having an oxide film structure.

Example FIG. 3A to FIG. 3G illustrate cross sections of a method of fabricating a PIP capacitor in accordance with embodiments.

DESCRIPTION

Figure 3A:
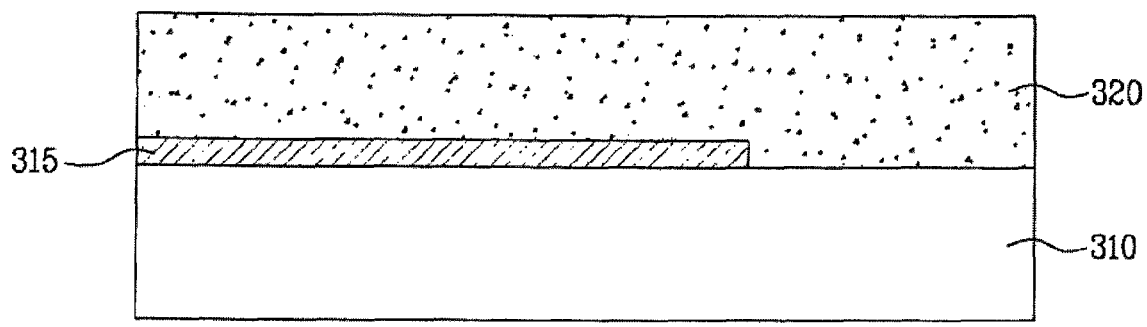

Embodiments relate to a method of fabricating a PIP capacitor. Referring to example FIG. 3A to FIG. 3G, cross sections illustrate a method of fabricating a PIP capacitor in accordance with embodiments. Referring to FIG. 3A, field oxide film 315 may be formed on and/or over semiconductor substrate 310, for an example, a silicon substrate. According to embodiments, a device isolating region and/or an active region may be defined. In embodiments, a field oxide film may be formed by Recessed-Local Oxidation of Silicon (R-LOCOS). In embodiments, first polysilicon layer 320 may be formed on and/or over a surface, which may be an entire surface, of silicon substrate 310 having field oxide film 315 formed thereover. In embodiments, first polysilicon layer 320 may be formed by CVD (Chemical Vapor Deposition).

Figure 3B:
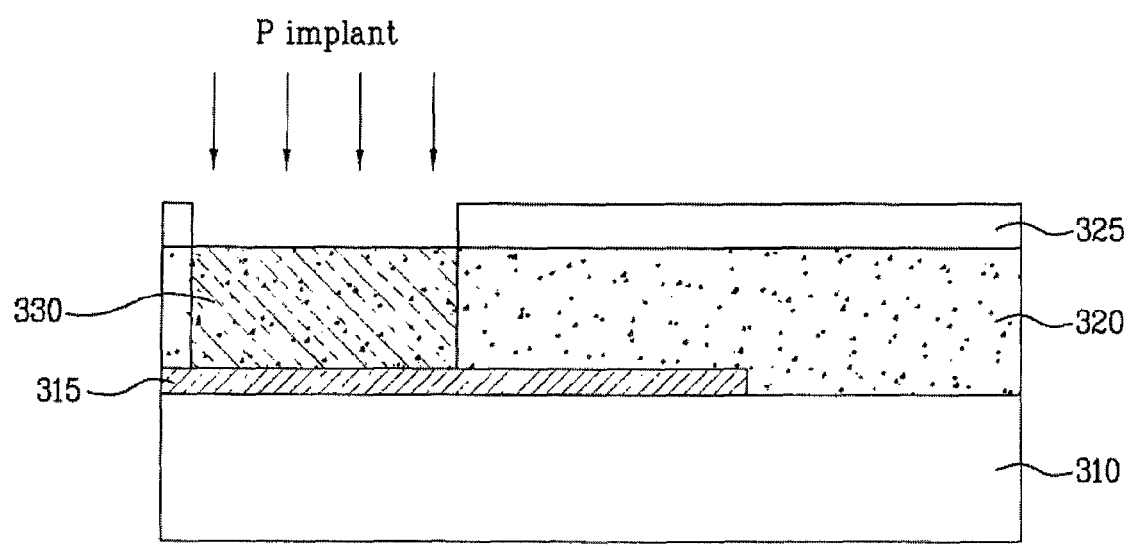

Referring to FIG. 3B, a photolithography step may be performed to form first photoresist pattern 325 on and/or over first polysilicon layer 320. According to embodiments, first photoresist pattern 325 may be patterned to expose a portion of first polysilicon layer 320, which may be a lower polysilicon electrode of a PIP capacitor to be formed on and/or over field oxide film 315. In embodiments, impurity ions, for example phosphorus, may be implanted on and/or over first polysilicon layer 320 exposed using first photoresist pattern 325 as a mask.

Figure 3C:
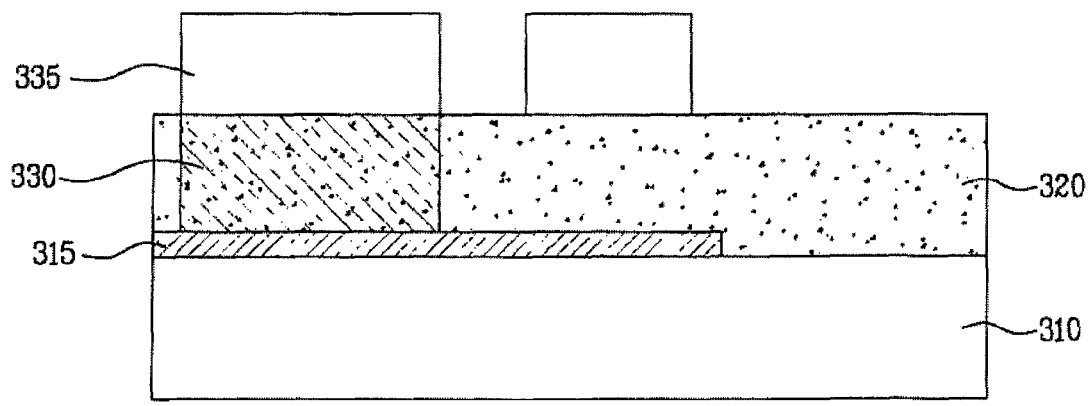

Referring to FIG. 3C, first photoresist pattern 325 may be removed, for example by ashing and/or stripping. According to embodiments, second photoresist pattern 335 may be formed on and/or over first polysilicon layer 320, which may have impurity ions implanted thereover. In embodiments, second photoresist pattern 325 may be formed to cover region 330 of first polysilicon layer 320 which may have impurity ions implanted thereover. In embodiments, second photoresist pattern 325 may be formed to cover another portion of first polysilicon layer 320 which may be a polysilicon resistor to be formed on an/or over field oxide film 315, and/or to expose other regions.

Figure 3D:
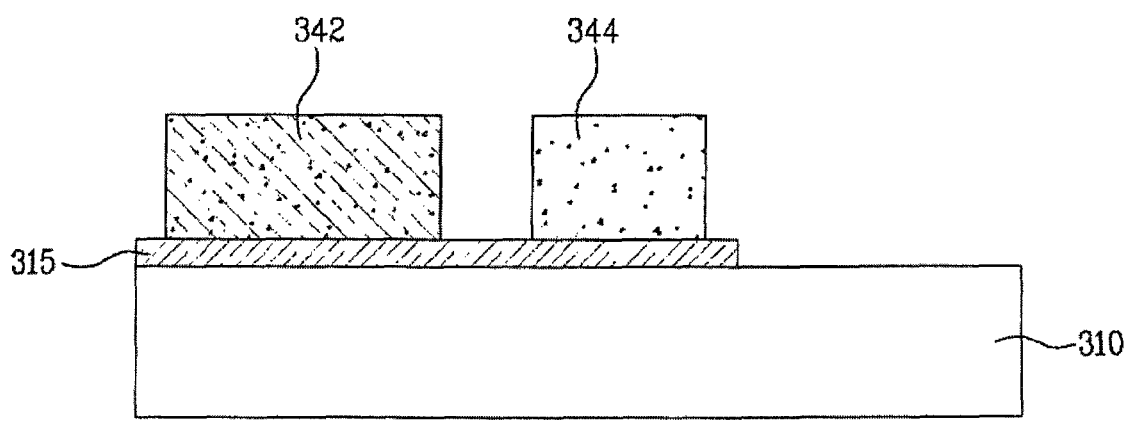

Referring to FIG. 3D, first polysilicon layer 320 exposed may be etched by using second photoresist pattern 335 as a mask, for example to form lower polysilicon electrode 342 and/or polysilicon resistor 344. According to embodiments, an active region of silicon substrate 310 may be exposed by etching. In embodiments, second photoresist pattern 335 remaining after etching may be removed.

Figure 3E:
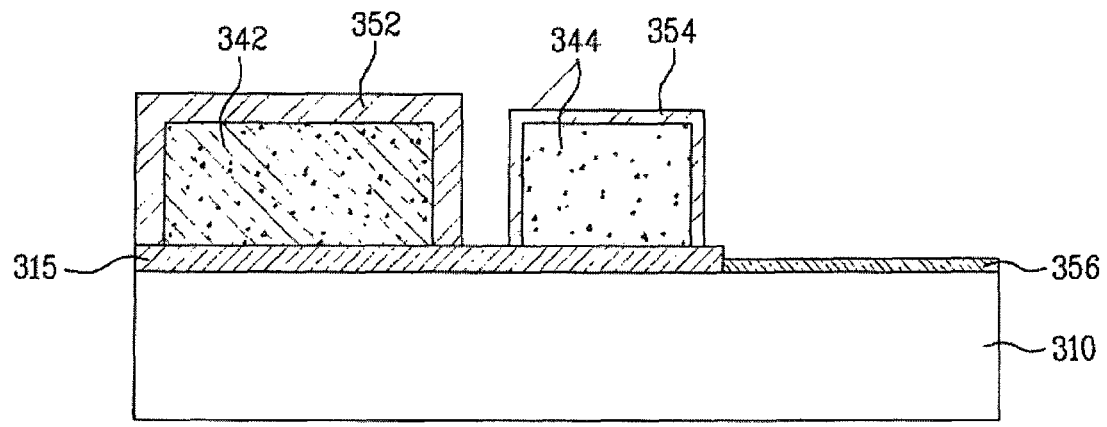

Referring to FIG. 3E, silicon substrate 310 may have lower polysilicon electrode 342 and/or polysilicon resistor 344 formed thereover, and may be oxidized. According to embodiments, an oxidizing step may include thermal oxidizing. In embodiments, thermal oxidizing may enable oxide films to grow on and/or over tops and/or side walls of lower polysilicon electrode 342 and/or polysilicon resistor 344, respectively, and/or exposed silicon substrate 310. In embodiemnts, an oxide film formed on and/or over a top and/or side walls of lower polysilicon electrode 342 may refer to a first oxide film, and an oxide film formed on and/or over a top and/or side walls of polysilicon resistor 344 may refer to second oxide film 354. In embodiments, an oxide film formed on and/or over an active region of silicon substrate 310 may refer to third oxide film 356.

According to embodiments, an oxide film grown by for example thermal oxidizing may have a thickness which may become relatively thicker as a concentration of impurities doped thereover becomes relatively higher. Referring to FIG. 3B, lower polysilicon electrode 342 may have an impurity concentration doped relatively higher than a polysilicon resistor and/or a silicon substrate owing to implantation of impurity ions, such as phosphorus.

According to embodiments, first oxide film 352 grown by the thermal oxidizing may have has a thickness thicker than a thickness of second oxide film 354 and/or third oxide film 356. In embodiments, using for example thermal oxidizing, first oxide film 352 may grow between approximately 500 Å and 600 Å, second oxide film 354 and/or third oxide film 356 may grow between approximately 100 Å and 200 Å. In embodiments, third oxide film 356 may serve as a gate oxide film of a gate electrode to be subsequently formed. In embodiments, thermal oxidizing may refer to gate oxidizing.

Figure 3F:
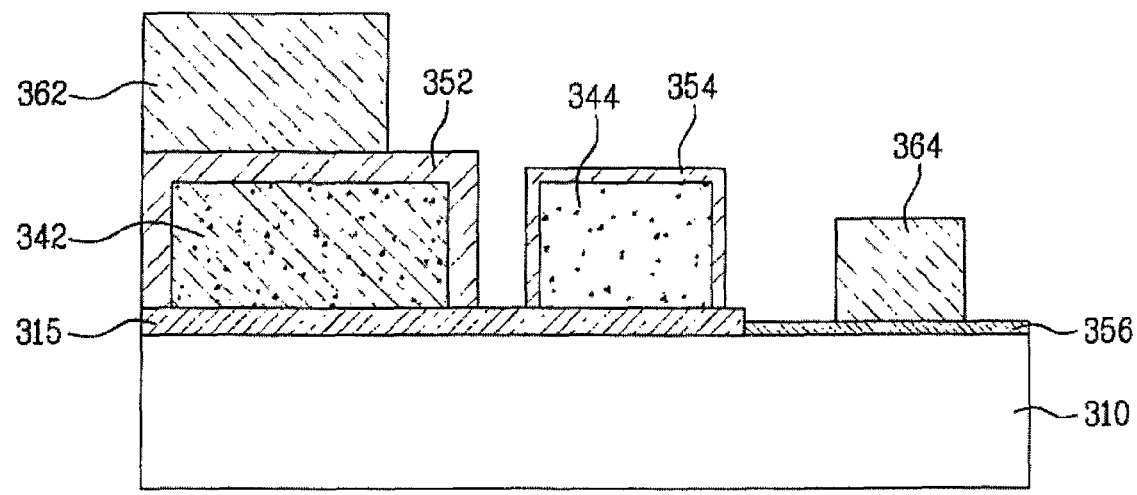

Referring to FIG. 3F, a second polysilicon layer may be formed on and/or over a surface, which may be an entire surface, of oxide films 352, 354 and/or 356 grown for example by gate oxidizing. According to embodiments, a second polysilicon layer may be patterned by photolithography and/or etching. In embodiments, upper polysilicon electrode 362 on and/or over a region of an upper side of first oxide film 352, and/or gate electrode 364 on and/or over third oxide film 356, may be formed.

Figure 3G:
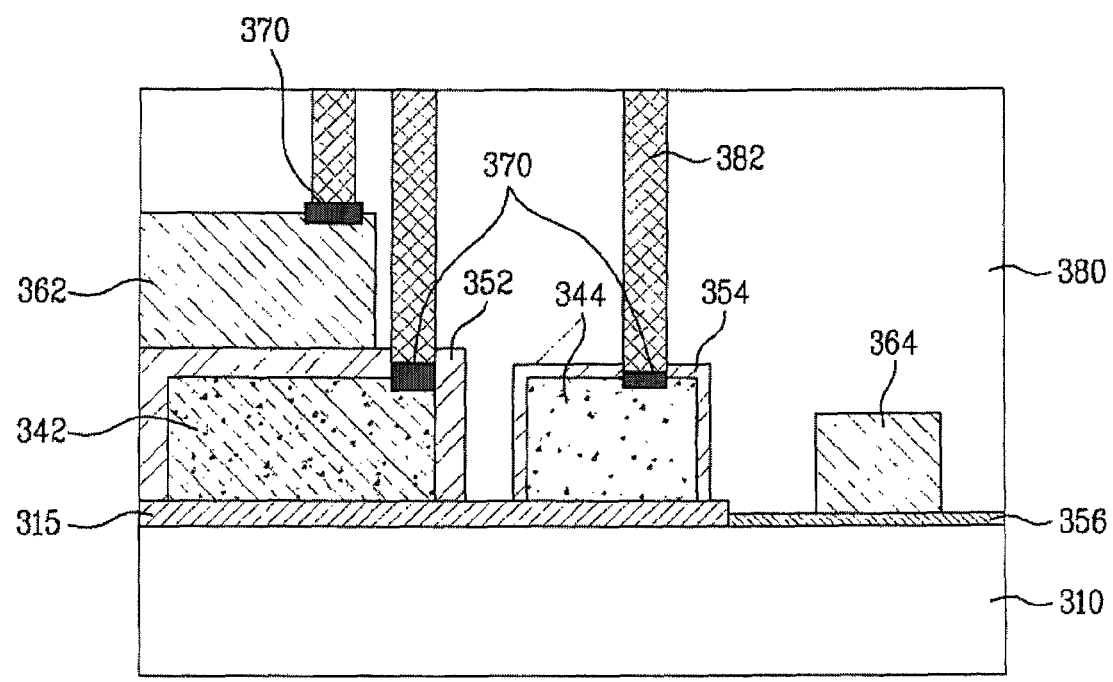

Referring to FIG. 3G, a region of first oxide film 352 and/or a region of second oxide film 354 may be etched selectively, which may expose a portion of lower polysilicon electrode 342 and/or a portion of polysilicon resistor 344. According to embodiments, a silicide step may be performed, which may form silicide 370 on and/or over a portion of upper polysilicon electrode 362, a portion of an exposed lower polysilicon electrode and/or a portion of a polysilicon resistor. In embodiments, by exposing a portion of a region of upper polysilicon electrode 362, silicide 370 may also be formed on and/or over a region of upper polysilicon electrode 362. In embodiments, insulating film 380 may be formed on and/or over a surface, which may be an entire surface, of silicon substrate 310 having silicide 370 formed thereover. In embodiments, contact hole 382 may be formed through insulating film 380, which may contact with silicide 370.

According to embodiments, in a method of fabricating a PIP capacitor, by forming oxide films on and/or over an upper side of a lower polysilicon electrode and/or an active region after forming lower polysilicon electrode 342, an insulating layer and a gate oxide film of a PIP capacitor may be formed by a one-time oxidizing step. In embodiments, since a polysilicon oxidizing step to form an insulating layer of a PIP capacitor and an oxidizing step to form a gate oxide film of a PIP capacitor may be made, not separately, but substantially simultaneously, an excessive cleaning may not be required to remove an oxide film from an active region formed in a polysilicon oxidizing step. In embodiments, uniformity of a transistor may be maximized.

According to embodiments, formation of an insulating layer of a PIP capacitor, not of an ONO, but of an oxide film by oxidizing, may minimize failure of formation of a silicide due to remaining nitride at the time of formation of silicide. In embodiments, productivity may be maximized by reducing one step in each of a furnace step and a cleaning step which may take relatively long time periods. If an insulating layer of a PIP capacitor is grown by a gate oxidizing step without performing a polysilicon oxidizing step, an insulating layer of a PIP capacitor may have a thickness thinner than when a polysilicon oxidizing step is performed. In embodiments, impurity doping of a lower polysilicon electrode by implantation may enable forming an insulating layer of a desired thickness of a PIP capacitor by growing an oxide film of a desired thickness on and/or over a lower polysilicon electrode.

It will be obvious and apparent to those skilled in the art that various modifications and variations can be made in the embodiments disclosed. Thus, it is intended that the disclosed embodiments cover the obvious and apparent modifications and variations, provided that they are within the scope of the appended claims and their equivalents.

What is claimed is:

1. A method comprising:
    forming a field oxide film over a semiconductor substrate defining a device isolating region and an active region;
    forming a lower polysilicon electrode and a polysilicon resistor having doped impurities over said field oxide film;
    performing an oxidizing step to form oxide films over said polysilicon electrode, said polysilicon resistor and said active region;
    forming an upper polysilicon electrode over a region of said oxide film formed over said lower polysilicon electrode and forming a gate electrode over said oxide film formed over said active region at substantially the same time,
    wherein said oxide film over said lower polysilicon electrode is thicker than said oxide films formed over at least one of said polysilicon resistor and said active region.

2. The method of claim 1, wherein said semiconductor substrate comprises silicon.

3. The method of claim 1, wherein said oxide films are formed over at least one of tops and side walls of said lower polysilicon electrode and said polysilicon resistor.

4. The method of claim 1, wherein forming said lower polysilicon electrode and said polysilicon resistor comprises:
    depositing a polysilicon layer over a surface of said semiconductor substrate including said field oxide film;
    injecting impurity ions into a region of said polysilicon layer; and
    removing said polysilicon layer except a region of said polysilicon layer having said injected impurity ions and said polysilicon layer for said polysilicon resistor.

5. An apparatus comprising:
    a field oxide film formed over a semiconductor substrate defining a device isolating region and an active region;
    a lower polysilicon electrode including doped impurities formed over said field oxide film;
    a first oxide film formed over said lower polysilicon electrode;
    a second oxide film formed over said active region;
    an upper polysilicon electrode formed over a region of said first oxide film and a gate electrode formed over a portion of said second oxide film at substantially the same time; and
    a third oxide film formed over said polysilicon resistor,
    wherein said oxide film over said lower polysilicon electrode is thicker than said oxide films formed over said polysilicon resistor and said active region.

6. The apparatus of claim 5, wherein said semiconductor substrate comprises silicon.

7. The apparatus claim 5, wherein said first oxide film is formed over at least one of a top and side walls of said lower polysilicon electrode.

8. The apparatus of claim 5, wherein said first oxide film is thicker than said second oxide film.

9. The apparatus of claim 5, comprising:
    a selectively etched region of said first oxide film to expose a portion of said lower polysilicon electrode; and
    silicide formed over at least one of a portion of said upper polysilicon electrode and said exposed portion of said lower polysilicon electrode.

10. The apparatus of claim 5, wherein said oxide film comprises a thickness which increases as a concentration of said impurities increases.

11. The apparatus of claim 5, comprising a polysilicon resistor having doped impurities over said field oxide film.

* * * * *